US008435846B2

(12) United States Patent
Cheng et al.

(10) Patent No.: US 8,435,846 B2
(45) Date of Patent: May 7, 2013

(54) SEMICONDUCTOR DEVICES WITH RAISED EXTENSIONS

(75) Inventors: Kangguo Cheng, Schenectady, NY (US); Bruce B. Doris, Brewster, NY (US); Balasubramanian S. Haran, Watervliet, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 13/251,757

(22) Filed: Oct. 3, 2011

(65) Prior Publication Data

US 2013/0082308 A1 Apr. 4, 2013

(51) Int. Cl.
*H01L 21/336* (2006.01)
*H01L 21/461* (2006.01)
*H01L 29/76* (2006.01)
*H01L 29/66* (2006.01)

(52) U.S. Cl.
USPC ........... 438/197; 438/300; 438/739; 257/288; 257/327; 257/E21.619; 257/E21.621; 257/E21.624

(58) Field of Classification Search .................. 257/327, 257/288, E21.619, E21.621, E21.624, E21.634, 257/E21.635, E21.637; 438/197, 300, 739
See application file for complete search history.

(56) References Cited

U.S. PATENT DOCUMENTS

| 6,593,618 | B2 | 7/2003 | Kamata et al. |
| 6,812,105 | B1 | 11/2004 | Dokumaci et al. |
| 6,828,630 | B2 | 12/2004 | Park et al. |
| 6,881,635 | B1 | 4/2005 | Chidambarrao et al. |
| 6,914,303 | B2 | 7/2005 | Doris et al. |
| 7,037,818 | B2 * | 5/2006 | Dokumaci et al. ............ 438/595 |
| 7,118,978 | B2 | 10/2006 | Okamura |
| 7,432,162 | B2 | 10/2008 | Chung et al. |
| 7,648,868 | B2 | 1/2010 | Majumdar et al. |

OTHER PUBLICATIONS

Kavalieros, J., et al. "Tri-Gate Transistor Architecture With High-K Gate Dielectrics, Metal Gates and Strain Engineering" 2006 Symposium on VLSI Technology Digest of Technical Papers. Jun. 2006. (2 Pages).

Tan, K., et al. "Strained P-Channel Finfets With Extended η-Shaped Silicon-Germanium Source and Drain Stressors" IEEE Electron Devices Letters, vol. 28, No. 10. Oct. 2007. pp. 905-908.

* cited by examiner

*Primary Examiner* — Julio J Maldonado
*Assistant Examiner* — Moin Rahman
(74) *Attorney, Agent, or Firm* — Tutunjian & Bitetto, P.C.; Vazken Alexanian

(57) ABSTRACT

Transistor devices and methods of their fabrication are disclosed. In one method, a dummy gate structure is formed on a substrate. Bottom portions of the dummy gate structure are undercut. In addition, stair-shaped, raised source and drain regions are formed on the substrate and within at least one undercut formed by the undercutting. The dummy gate structure is removed and a replacement gate is formed on the substrate.

8 Claims, 10 Drawing Sheets

SEMICONDUCTOR DEVICES WITH RAISED EXTENSIONS

BACKGROUND

1. Technical Field

The present invention relates to semiconductor devices, and, more particularly, to semiconductor devices with raised extensions.

2. Description of the Related Art

Consistent design goals throughout the development of semiconductor technology have been the improvement of speed and efficiency of semiconductor devices. With regard to transistor devices, such goals can be achieved by reducing the source and drain resistance. One means of reducing source and drain resistance is to employ raised source and drain regions (RSD) to form ultra-shallow junctions. RSDs can be implemented in bulk and partially depleted silicon-on-insulator (PDSOI) substrates and in fully depleted devices, such as devices on extremely thin silicon-on-insulator (ETSOI) substrates, fin-field-effect transistor (finFET) devices and trigate devices, to lower the source-to-drain resistance.

SUMMARY

One embodiment is directed to a method for fabricating a transistor device. In accordance with the method, a dummy gate structure is formed on a substrate. Bottom portions of the dummy gate structure are undercut. In addition, stair-shaped, raised source and drain regions are formed on the substrate and within at least one undercut formed by the undercutting. The dummy gate structure is removed and a replacement gate is formed on the substrate.

Another embodiment is directed to a transistor device including a gate structure and raised source and drain regions above a substrate. The gate structure includes a gate electrode and a gate dielectric. At least one of the raised source or drain regions includes a stair-shaped extension that is disposed toward the gate structure. The device also includes one or more spacers between the gate structure and at least one of the raised source and drain regions, where the one or more spacers includes a flared top portion that facilitates formation of the gate structure.

An alternative embodiment is directed to a transistor device including a gate structure, a source region, a drain region and a raised stair-shaped extension. Here, the gate structure is above a substrate. The source region includes a raised source portion that is above the substrate and a source stressor portion that is within the substrate and provides a stress to a channel between the source region and the drain region to enhance conductivity of the channel. The drain region includes a raised drain portion that is above the substrate and a stressor drain portion that is within the substrate and provides a stress to the channel to enhance the conductivity of the channel. The raised stair-shaped extension is part of one of the source or drain regions, is disposed above the substrate and laterally abuts a side of the gate structure. In addition, the raised stair-shaped extension, the one of the source or drain regions and the stressor portion of the one of the source or drain regions share a common, cohesive lattice structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
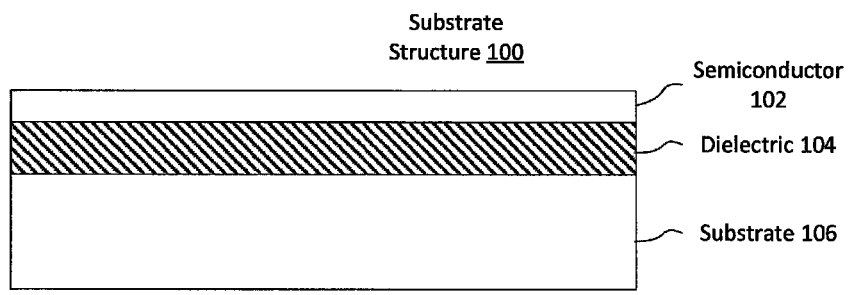
FIG. 1 is a cross-sectional view of an exemplary substrate for a transistor device in accordance with an embodiment of the present principles.

While employing raised source and drain regions can increase conductivity in a transistor, RSDs can adversely result in increased parasitic capacitance. Exemplary embodiments of the present principles described herein provide transistor devices that implement raised source and drain regions in a way that minimizes parasitic capacitance. For example, embodiments can develop and utilize stair-shaped source and drain regions that include raised extensions to minimize source and drain resistance as well as parasitic capacitance. In particular, the fabrication of RSDs can be substantially simplified by forming RSDs and their extensions in a single epitaxial growth step, thereby improving production cost and efficiency. Here, the single-epitaxial growth step is enabled by the use of dummy and replacement gates to permit the step extensions to be formed in undercuts beneath the dummy gate in the same epitaxial growth as the raised source and drain regions. Furthermore, the fabrication of the replacement gate can be significantly facilitated by the use of flared spacers that guide the replacement gate material in its appropriate position in a way that minimizes the formation of defects in the replacement gate. Advantageously, transistor devices can incorporate stressors in the source and drain region that can also be formed in the same epitaxial growth as the raised source and drain and their extensions by using the replacement gate in a similar manner.

As will be appreciated by one skilled in the art, aspects of the present invention may be embodied as a system, method, device or apparatus. Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of methods, apparatus (systems) and devices according to various embodiments of the present invention. It should also be noted that, in some alternative implementations, the functions noted in the block may occur out of the order noted in the figures. For example, two blocks shown in succession may, in fact, be performed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose systems that perform the specified functions or acts.

It is to be understood that the present invention will be described in terms of a given illustrative architecture having a substrate; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip including transistor devices of the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a semiconductor substrate structure 100 on which transistor devices in accordance with the present principles is depicted. The semiconductor substrate can be a bulk substrate, such as a bulk silicon or bulk silicon-germanium substrate, or can be a semiconductor-on-insulator substrate, such as an ETSOI substrate or a PDSOI substrate. A semiconductor-on-insulator substrate is used here for expository purposes. It should also be understood that although planar transistors are fabricated and employed in exemplary embodiments described herein, features discussed herein below can be utilized in multi-gate devices, such as finFETs and trigate devices. For example, the semiconductor substrate on which gates are fowled in accordance with the present principles can include fins of a multi-gate device.

Figure 2:
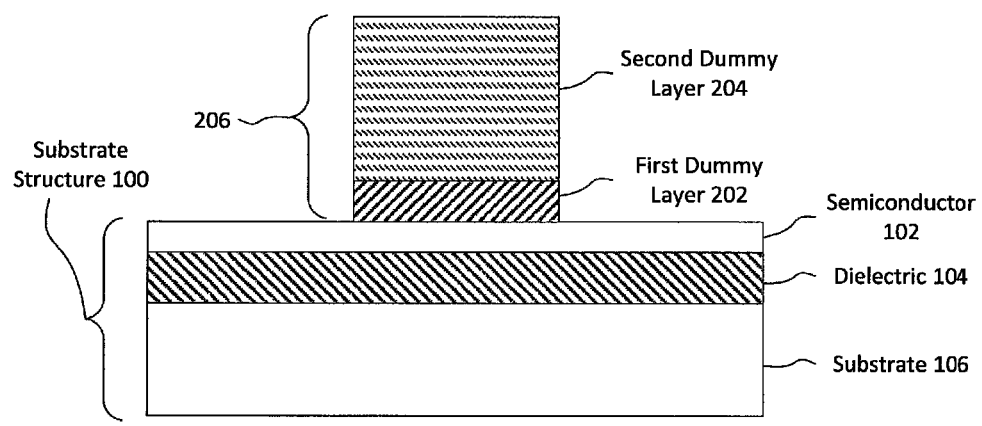
FIG. 2 is a cross-sectional view of an exemplary structure illustrating the formation of a dummy gate in accordance with an embodiment of the present principles.

The substrate structure 100 can include a semiconductor layer 102, a dielectric layer 104 and a semiconductor substrate 106. The layers 102 and 106 can be composed of the same or different semiconductor materials, such as Si and SiGe. In addition, as indicated above, the layer 102 can be an ETSOI layer. Further, the dielectric layer 104 can be an oxide layer, such as a buried oxide (BOX) layer, a silicon dioxide layer, among other oxides. As noted above, one aspect of the present principles involves the formation of a dummy gate to facilitate the fabrication of raised source and drain regions, along with their extensions. As illustrated in FIG. 2, the dummy gate 206 can be formed on the semiconductor layer 102 and can be composed of a first dummy layer 202, which can abut the semiconductor layer 102, and a second dummy layer 204. The first dummy layer 202 can be an oxide, such as silicon dioxide formed by thermal oxidation or deposition (e.g., CVD), and the second dummy layer 204 can be silicon nitride deposited by chemical vapor deposition (CVD). Other suitable materials can also be used. The first dummy layer 202 can have a thickness ranging from 3 nm to 20 nm and the second dummy layer 204 can have a thickness ranging from 10 nm to 100 nm. Preferably, the first dummy layer can have a thickness ranging from 10 nm to 15 nm and the second dummy layer 204 can have a thickness ranging from 30 nm to 50 nm.

Figure 3:
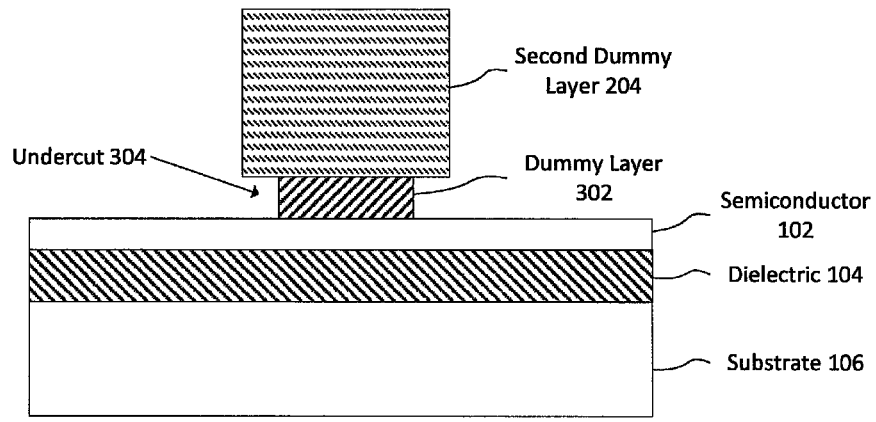
FIG. 3 is a cross-sectional view of an exemplary structure illustrating the formation of undercuts in a bottom portion of a dummy gate in accordance with an embodiment of the present principles.
Figure 4:
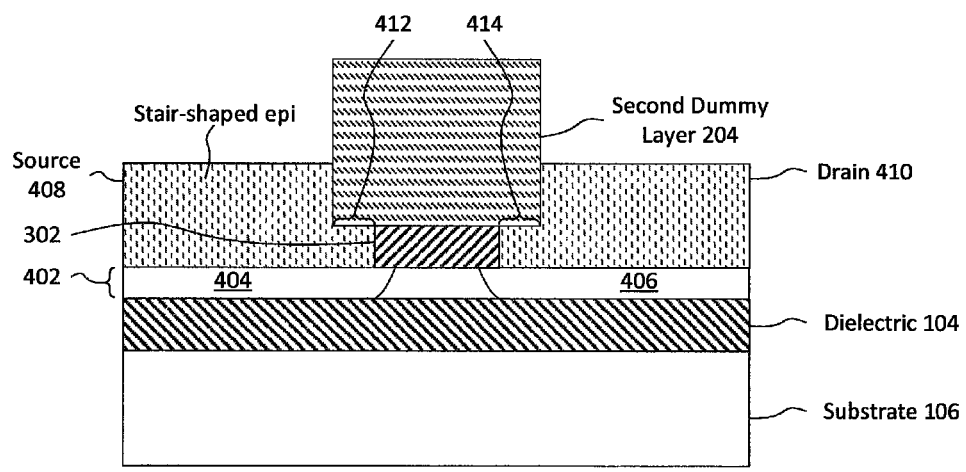
FIG. 4 is a cross-sectional view of an exemplary structure illustrating the formation of stair-shaped, raised source and drain regions in accordance with an embodiment of the present principles.

As depicted in FIG. 3, an undercut 304 can be formed in the first dummy layer 202 to form layer 302 by performing a well-controlled etching process. Here, a precise etch can be achieved by employing a chemical oxide removal (COR) process or a hydrofluoric acid (HF) etch. The COR or HF process can also serve as a pre-cleaning step for a following epitaxial growth process. In one embodiment, the undercut 304 has a width ranging from 2 nm to 30 nm, preferably from 4 nm to 20 nm, and more preferably ranging from 5 nm to 10 nm. Further, as illustrated in FIG. 4, raised extension 412, 414 and source 408 and drain 410 regions can be epitaxially grown. Here, silicon, or another appropriate semiconductor material, can be deposited directly over the semiconductor layer 102 and within the undercut 304, which facilitates the formation of the step-extensions 412, 414. In particular, the formation of the source 408, drain 410 and extension 412, 414 regions can be performed in a single epitaxial growth step, which substantially reduces the complexity of the fabrication process. Thus, a crystal lattice formed in the regions 408-414 can be one, cohesive and common lattice structure. As depicted in FIG. 4, a thick epi layer is formed for the source 408 and drain 410 regions, while a thin epi layer is formed in the extension regions 412 and 414 within the undercuts 304. Preferably the source 408, drain 410 and extension 412, 414 regions are in-situ doped with an appropriate doping material, such as boron, for p-type field effect transistors (pFET), and phosphorous, for n-type field effect transistors (nFET). However, other dopants and doping methods can be employed, such as ion implantation, plasma doping, solid phase doping, gas phase doping, or any suitable combination of these techniques. Moreover, a thermal anneal, for example, a rapid thermal anneal (RTP), can be performed to drive the dopant into the semiconductor layer 102 and thereby dope at least a portion of region 402 to form the extension regions 404 and 406 under the source and drain of the transistor. Although not shown in the figures to permit ease of understanding, a silicide can be formed on the source 408 and drain regions 410 to form contacts to conductive lines. Alternatively, silicide can be formed on the source 408 and drain regions 410 later in the process by forming a through-trench silicide contact.

Figure 5:
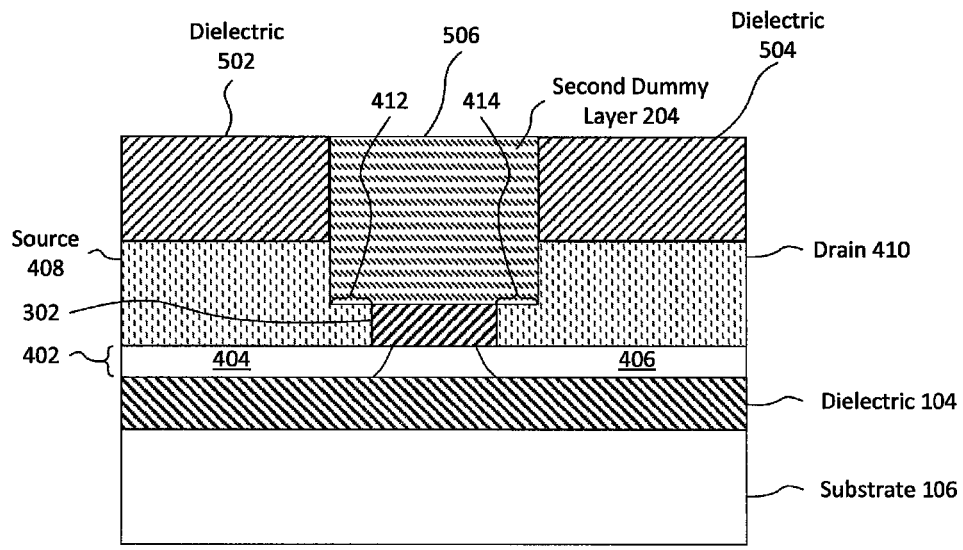
FIG. 5 is a cross-sectional view of an exemplary structure illustrating the formation of dielectric layers over raised source and drain regions in accordance with an embodiment of the present principles.
Figure 6:
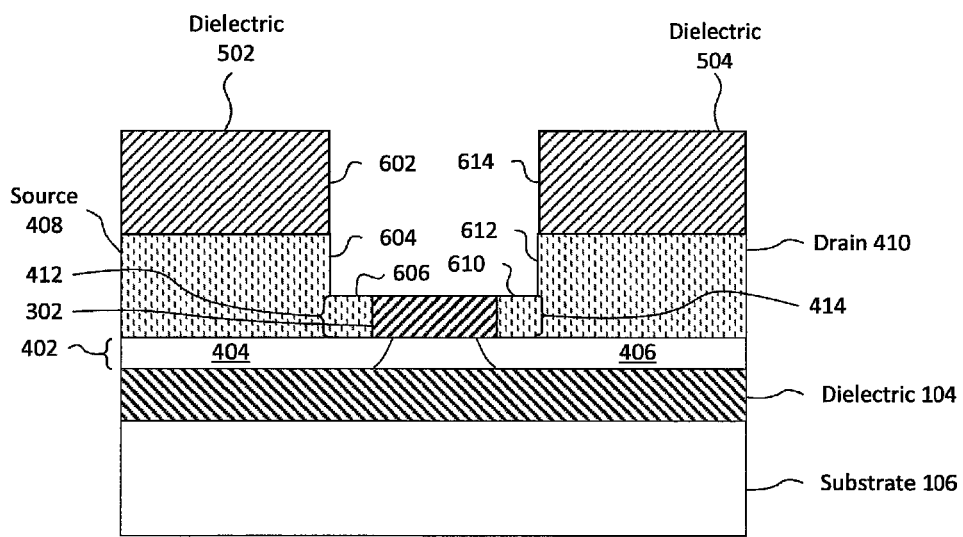
FIG. 6 is a cross-sectional view of an exemplary structure illustrating the removal of a dummy gate layer in accordance with an embodiment of the present principles.
Figure 7:
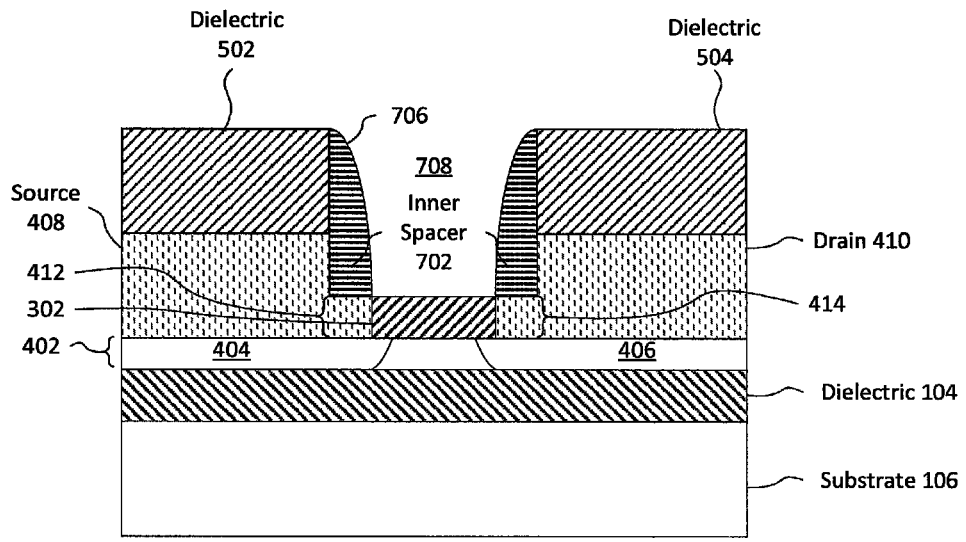
FIG. 7 is a cross-sectional view of an exemplary structure illustrating the formation of a flared inner gate spacer in accordance with an embodiment of the present principles.
Figure 8:
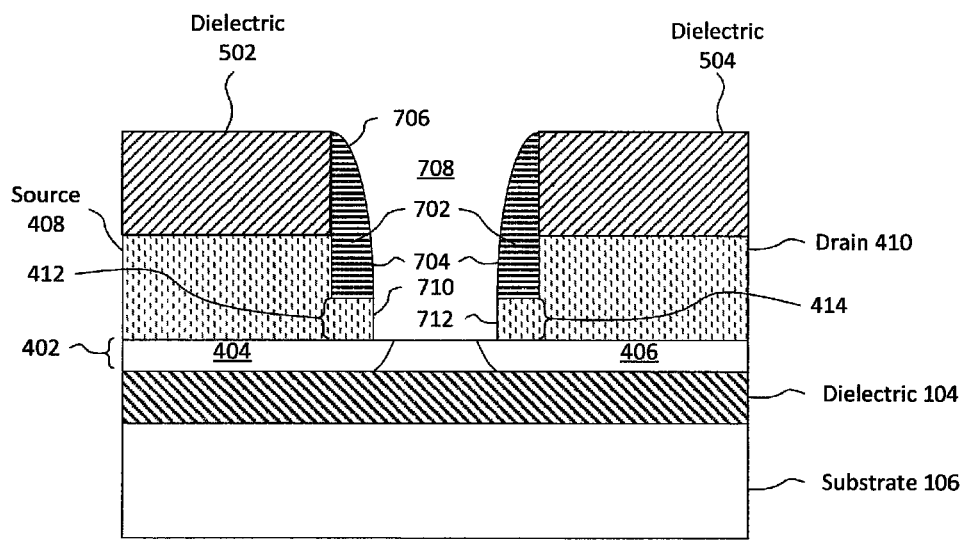
FIG. 8 is a cross-sectional view of an exemplary structure illustrating the removal of a dummy gate layer in accordance with an embodiment of the present principles.
Figure 9:
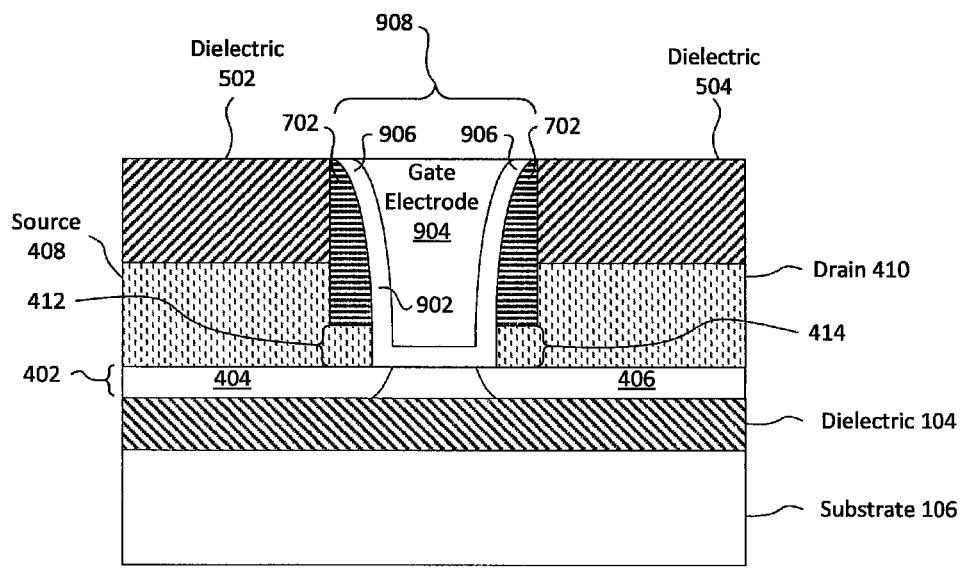
FIG. 9 is a cross-sectional view of an exemplary structure illustrating the formation of a replacement gate in accordance with an embodiment of the present principles.

As illustrated in FIG. 5, a dielectric material, such as an oxide material described above, can be deposited over the source 408 and drain 410 regions to form dielectric regions 502 and 504. Further, the surface of the resulting structure can be planarized by an appropriate planarization process, such as chemical-mechanical planarization (CMP), to expose the top surface 506 of the dummy spacer gate. In addition, with reference to FIG. 6, the second dummy gate layer 204 can be removed. For example, if the second dummy gate layer 204 is silicon nitride, a selective etching, such as an etch solution containing hot phosphoric acid, can be used to remove silicon nitride selectively with respect to other adjacent layers. Moreover, as illustrated in FIG. 7, at least one inner spacer 702 can be formed above the step-extensions 412 and 414 of the raised source/drain regions and along the inside surfaces 602-614 of the regions 502, 408, 412, 414, 410 and 504, respectively. For example, the spacer 702 can be composed of a nitride, such as a silicon nitride. The spacers can be formed by a deposition followed by an anisotropic etch such as reactive ion etch (RIE). The inner spacer 702 will further separate and widen the space between the replacement gate, described in more detail herein below, and the raised source 408/drain 410 to further reduce parasitic capacitance between the gate and the RSD. As depicted in FIG. 7, the tapered inner spacer includes flared ends 706 that render the gate region opening 708 wider at its top than its bottom, which substantially assists the gate filling process, described herein below. Without the flared structure, the later filling process of the gate electrode may result in undesirable seams or voids in the final gate. Thus, the flared structure can reduce the incidence of defects in the replacement gate. Subsequently, as shown in FIG. 8, the dummy gate layer 302 can be selectively removed. For example, if the dummy gate layer 302 is an oxide, the layer 302 can be removed by wet etchant containing hydrofluoric acid or by chemical oxide removal (COR). Thereafter, referring to FIGS. 8-9, a dielectric material can be deposited along the inner surfaces 704 of the inner spacers 702 and along the side surfaces 710 and 712 of the raised source/drain junctions 412 and 414, respectively. The gate dielectric 902 can be a high-k dielectric material, such as zirconate titanate, barium strontium titanate, hafnium silicate or hafnium oxide. Further, the gate dielectric 902 can be grown or deposited over the inner spacers 702 and the sides 710 and 712 of the raised source/drain junctions 412 and 414 such that the sides 710, 712 of the raised source/drain junctions or step-extensions 412, 414 laterally abut the gate dielectric 902 at a side of the gate structure 908. Moreover, the top of a portion of extension junctions 404 and 406 in the channel region of the structure 908 can also abut the formed gate dielectric 902. In addition, the ends 906 of the gate dielectric 902 can retain the tapered shape of the inner spacer 702 such that the gate region is wider at the top than the bottom to facilitate the formation of the gate electrode and reduce the incidence of defects in the gate electrode, as indicated above. The high-k gate dielectric can be deposited, for example, by atomic layer deposition (ALD), chemical vapor deposition (CVD), physical vapor deposition (PVD), or any suitable combination of these methods. An interfacial layer (not shown) such as silicon oxide or silicon oxynitride can be formed underneath the high-k gate dielectric, for example, by chemical oxidation, or low temperature oxidation or oxynitridation, before high-k deposition. Thereafter, the gate electrode 904 can be formed to complete the replacement gate 908. The gate electrode can be a metal electrode (for example: titanium, titanium nitride, tantalum nitride, aluminum, etc.) or can be doped (highly conducting) polysilicon. Subsequently, the fabrication of the transistor device can be completed. For example, contacts, vias, metal lines, and/or inter-layer dielectrics, etc. can be formed as is known in the art to complete the transistor device.

As indicated above, the use of the dummy and replacement gate permits the formation of the raised source 408, drain 410 and extension regions 412, 414 in a single epitaxial growth step, thereby improving production cost and efficiency of a transistor device that have a relatively low source and drain resistance and a minimal parasitic capacitance. Further, the fabrication of the replacement gate is substantially facilitated by the use of flared inner spacers to ensure proper positioning and formation of the replacement gate material.

Figure 10:
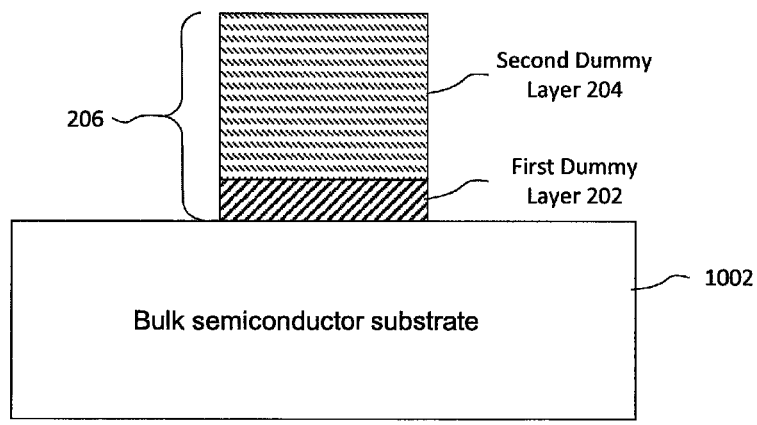
FIG. 10 is a cross-sectional view of an exemplary structure illustrating the formation of a dummy gate in accordance with an embodiment of the present principles.
Figure 11:
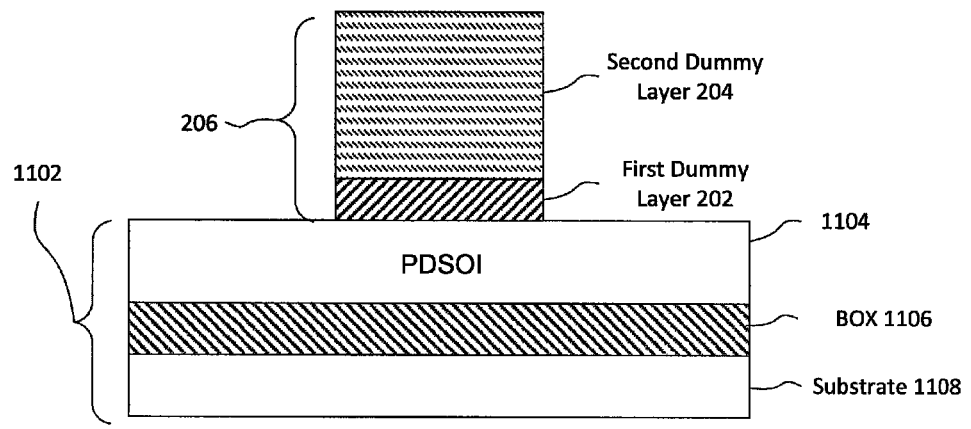
FIG. 11 is a cross-sectional view of an exemplary structure illustrating the formation of a dummy gate in accordance with an embodiment of the present principles.

In accordance with exemplary aspects of the present principles, stressors can be implemented in a transistor device to reduce resistivity in the channel region between the source and the drain. As noted above, by using dummy and replacement gate features, such stressors can be formed together with the raised source, drain and extensions in a single epitaxy process. Here, the same substrates described above with respect to FIG. 1 can be employed to form transistors that include stressors. For example, as illustrated in FIGS. 10-11, the dummy gate 206 can be formed on a bulk semiconductor substrate 1002 or on a PDSOI substrate structure 1102, which includes a PDSOI layer 1104, a BOX layer 1106 and a semiconductor substrate layer 1108. However, it should be understood that any appropriate substrate described above can be used here. For illustrative purposes, the formation of transistors of the present principles that include stressors is described with respect to the bulk semiconductor substrate 1002. However, the same processes can be applied to a PDSOI substrate and other substrates. Furthermore, the dummy gate 206 can be formed in the same manner described above with respect to FIG. 2.

Figure 12:
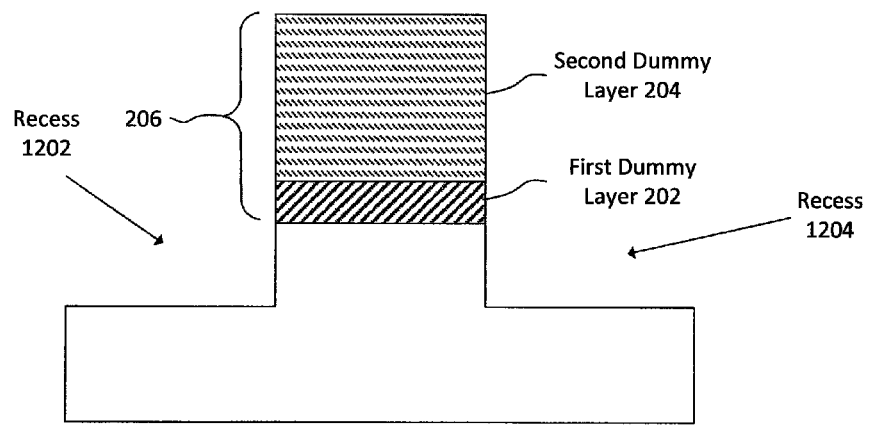
FIG. 12 is a cross-sectional view of an exemplary structure illustrating the formation of recesses in accordance with an embodiment of the present principles.
Figure 13:
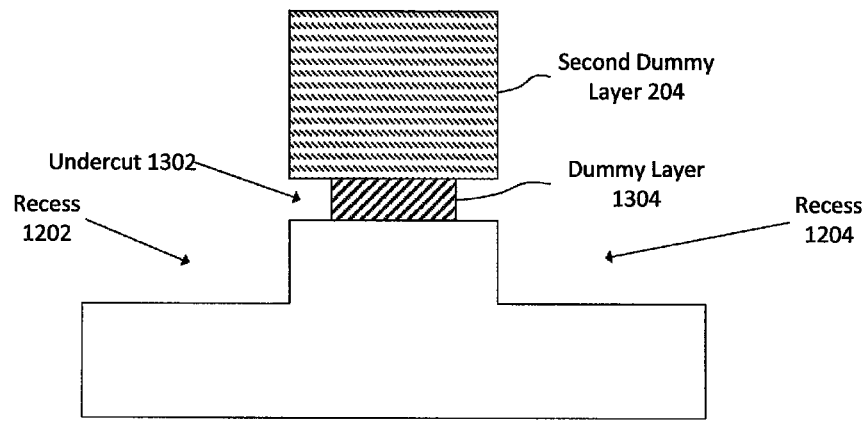
FIG. 13 is a cross-sectional view of an exemplary structure illustrating the formation of undercuts in a bottom portion of a dummy gate in accordance with an embodiment of the present principles.
Figure 14:
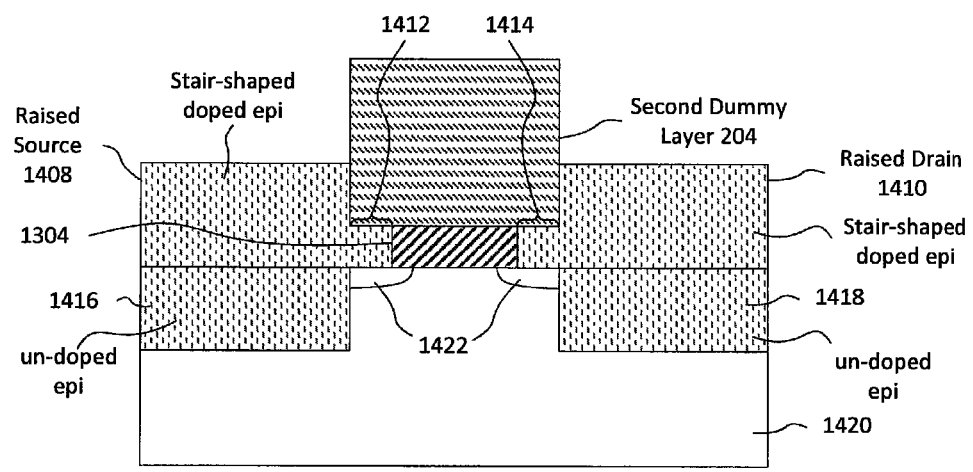
FIG. 14 is a cross-sectional view of an exemplary structure illustrating the formation of stair-shaped, raised source and drain regions in accordance with an embodiment of the present principles.

Referring to FIG. 12, to form embedded source and drain structures, the substrate 1002 can be etched to an appropriate depth to form recesses 1202 and 1204, for example, by reactive ion etching (RIE). For example, the depth of the recesses 1202 and 1204 below the first dummy layer 202 of the dummy gate 206 can be the desired depth of the embedded source and drain stressors, respectively. As illustrated in FIG. 13, undercuts 1302 can be formed in the first dummy layer 202 to form layer 1304. For example, the undercuts can be formed in the same manner described above with respect to FIG. 3. Further, as illustrated in FIG. 14, raised extensions 1412, 1414, raised source 1408 and drain 1410 regions, and embedded source 1416 and drain 1418 stressors can be epitaxially formed by employing a single epitaxial growth step. As described above with respect to FIG. 4, the undercuts facilitate the formation of the step-extensions 1412, 1414. Here, an appropriate semiconductor material can be deposited directly in and over the recesses 1202 and 1204, and within the undercuts 1302 to form the raised extensions 1412, 1414 therein. For example, for pFET devices SiGe can be used as the embedded stressor, while for nFET devices, SiC can be used as the embedded stressor. As indicated above, the source and drain stressors 1416, 1418 can provide a respective stress to the channel between the source region and the drain region to enhance the conductivity of the channel. Optionally, at least a top portion of the grown epi layers can be in-situ doped with an appropriate doping material. For example, the raised source 1408 and drain 1410 regions, and their respective extensions 1412 and 1414, can be doped while the embedded stressors 1416 and 1418 can be essentially un-doped or lightly doped. For nFET devices, phosphorous or arsenic can be used as the dopants, while for pFET devices, boron can be used as the dopant. Similar to the doping described above, other doping methods, such as ion implantation, can be employed. Further, to ensure that the embedded source 1416 and drain 1418 regions apply conductivity-enhancing stresses to the channel between the source and drain of the device, the embedded source 1416 and drain 1418 regions can be configured to have a lattice structure/constant that is different from that of the substrate 1420. It should be noted that the crystal lattice formed in the regions 1408-1418 can be one, cohesive and common lattice structure. A thermal anneal, such as a spike anneal, for example, can be performed to drive the dopants into the extensions of the substrate 1420 to form the doped channel regions 1422 between the source and drain of the transistor. Additionally, a silicide can be formed on the raised source 1408 and drain regions 1410 to form contacts to conductive lines in the same manner described above with respect to FIG. 4.

Figure 15:
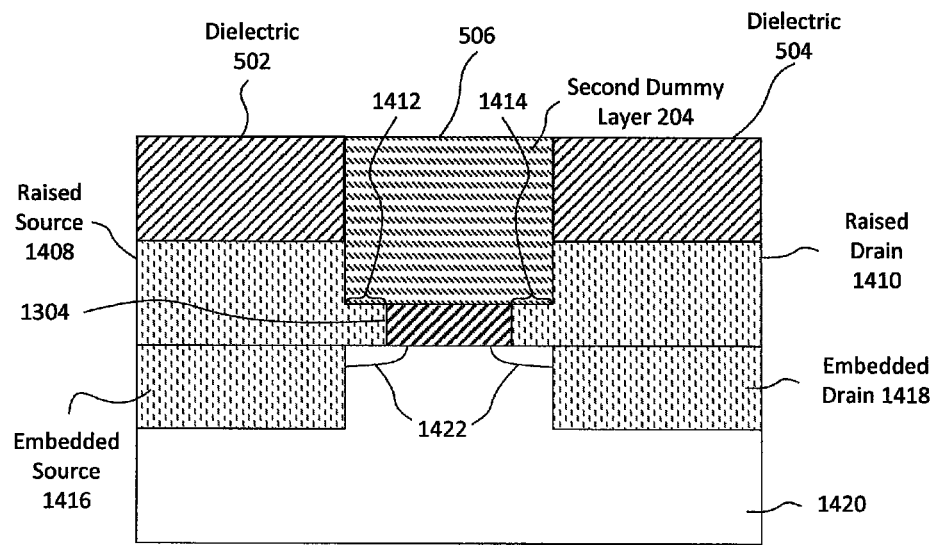
FIG. 15 is a cross-sectional view of an exemplary structure illustrating the formation of dielectric layers over raised source and drain regions in accordance with an embodiment of the present principles.
Figure 16:
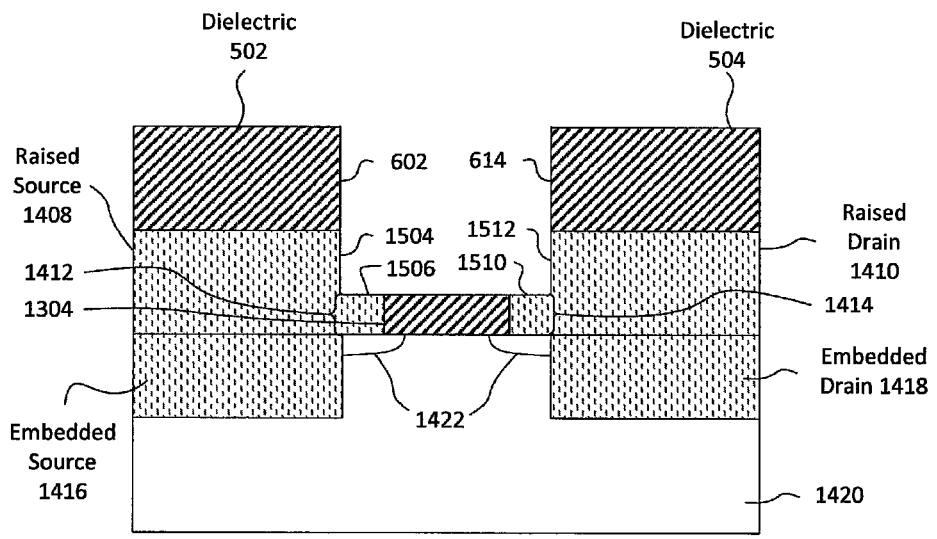
FIG. 16 is a cross-sectional view of an exemplary structure illustrating the removal of a dummy gate layer in accordance with an embodiment of the present principles.
Figure 17:
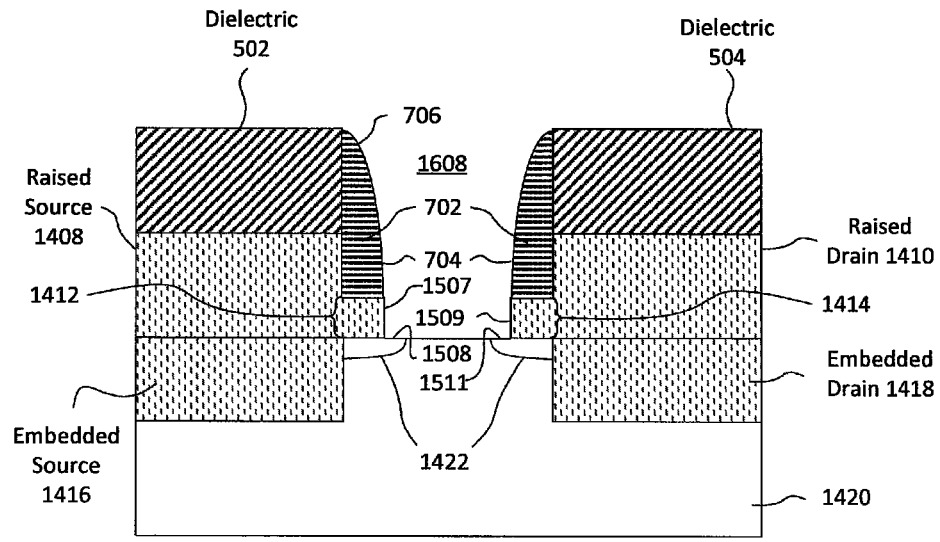
FIG. 17 is a cross-sectional view of an exemplary structure illustrating the formation of a flared inner gate spacer in accordance with an embodiment of the present principles.
Figure 18:
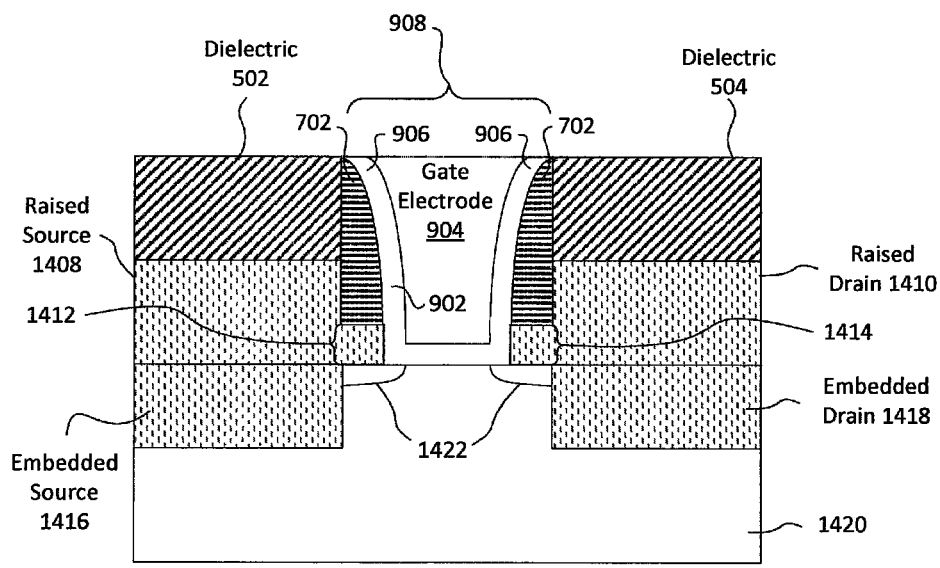
FIG. 18 is a cross-sectional view of an exemplary structure illustrating the formation of a replacement gate in accordance with an embodiment of the present principles.

With reference to FIG. 15, dielectric layers 502 and 504 can be deposited over the raised source 1408 and drain 1410 as described above with respect to FIG. 5. In addition, the surface of the sacrificial/dummy layer 204 can be planarized, as described above. As illustrated in FIG. 16, the dummy gate layer 204 can be removed, for example, in the same manner discussed above with respect to FIG. 6. Further, as depicted in FIG. 17, the replacement gate spacers 702 can be formed and the layer 1304 of the dummy gate can be removed as, for example, described above with respect to FIGS. 7-8. For example, the spacers 702 can include flared ends 706 to ease the formation of the replacement gate in the region 1608, which is wider at its top portion. In addition, the spacers 702 can be formed along the inside surfaces 602, 1504, 1506, 1510, 1512 and 614 of the dielectric layer 502, the raised source region 1408, the extension 1412, the extension 1414, the drain region 1410 and the dielectric layer 504, respectively. Here, referring to FIG. 18, the replacement gate 908 can be formed in the same manner discussed above with regard to FIG. 9. For example, the gate dielectric 902 can be formed over the surfaces 704, 1507, 1508, 1511 and 1509. In addition, gate electrode 904 can be formed and the transistor device can be completed in the same manner described above with respect to FIG. 9.

Figure 19:
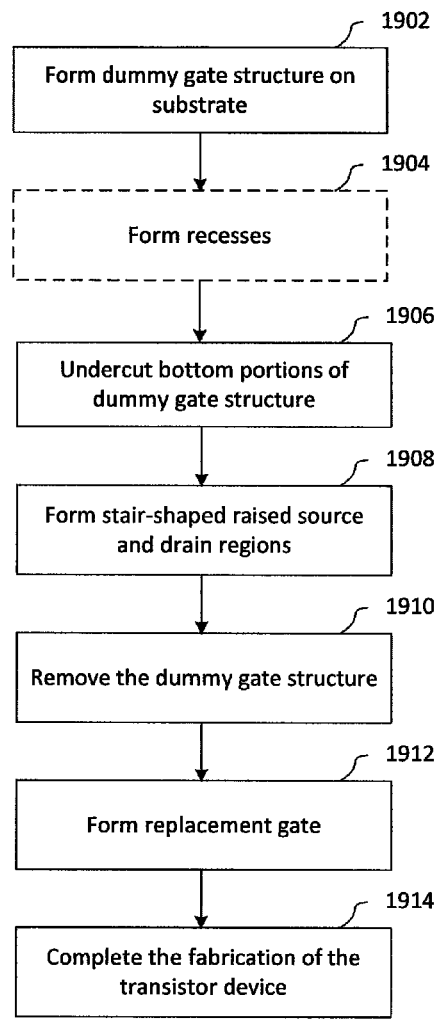
FIG. 19 is a block/flow diagram of a method for fabricating a transistor device in accordance with one exemplary embodiment of the present principles.

Referring now to FIG. 19, with continuing reference to FIGS. 1-18, a method 1900 for fabricating a transistor device in accordance with one exemplary embodiment is illustrated. It should be understood that any of the aspects of the present principles described above can be incorporated into the method 1900. The method 1900 can begin at step 1902, at which a dummy gate structure can be formed on a substrate. For example, the dummy gate structure 206 can be formed on a substrate structure as described above with respect to FIGS. 2, 10 and 11. For example, a first dummy gate layer 202 can be deposited on a substrate and a second dummy gate layer 204 can be deposited over the first dummy layer 202. Optionally, at step 1904, recesses can be formed in a substrate. For example, recesses 1202 and 1204 can be formed in a substrate to fabricate stressors as described above with respect to FIG. 12. At step 1906, bottom portions of the dummy gate structure can be undercut. For example, the dummy gate structure 206 can be undercut as described above with respect to FIGS. 3 and 13. At step 1908, stair-shaped, raised source and drain regions can be formed on the substrate and within at least one undercut formed by step 1906. For example, raised source and drain regions 408, 410 or 1408, 1410 can be formed as described above with respect to FIGS. 4 and 14, respectively. For example, as described above, semiconductor material can be grown over the substrate and within the undercuts 304 in a single epitaxial growth step. Further, if recesses are formed in accordance with FIG. 12, semiconductor material can be grown over the substrate, within the undercuts 1302 and within the recesses 1202, 1204 in a single epitaxial growth step. As stated above, the source stressor 1416 and the drain stressor 1418 formed in the recesses provide a respective stress to a channel between the source region and the drain region to enhance the conductivity of the channel. Moreover, extensions 412, 414, 1412 and 1414 can be formed in the raised source or drain regions, as described above. In addition, the raised and source regions can be doped as described above with respect to FIGS. 4 and 14. For example, the stair-shaped, raised source and drain regions can be doped and the source and drain stressors can remain un-doped. At step 1910, the dummy gate structure can be removed. For example, the dummy gate structure can be removed as described above with respect to FIGS. 6-8 and 16-17. For example, the dummy gate layer 204 can be removed. Thereafter, one or more inner spacers 702 can be formed prior to removing the dummy gate layers 302 and 1304. The inner spacers 702 can include a flared top portion that facilitates the subsequent formation of a replacement gate in a region that is bordered by the spacers and is between the source and drain regions. At step 1912, a replacement gate can be formed. For example, the replacement gate 908, which can include a gate dielectric 902 and a gate electrode 904, can be formed as described above with respect to FIGS. 9 and 18. As stated above, the extensions of the raised source and drain regions can laterally abut a gate dielectric of the replacement gate. At step 1914, the fabrication of the transistor device can be completed. For example, as noted above, contacts, vias, metal lines, and/or inter-layer dielectrics, etc. can be formed as is known in the art to complete the transistor device.

Having described preferred embodiments of semiconductor devices with raised extensions and methods of their fabrication (where the description of the embodiments are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a transistor device comprising:
   forming a dummy gate structure on a substrate;
   undercutting bottom portions of the dummy gate structure;
   forming stair-shaped, raised source and drain regions on the substrate and within at least one undercut formed by said undercutting;
   removing the dummy gate structure; and
   forming a replacement gate on the substrate.

2. The method of claim 1, wherein the removing further comprises forming at least one inner spacer, where each spacer includes a flared top portion that facilitates said forming of the replacement gate in a region that is bordered by the at least one inner spacer and is between the source and drain regions.

3. The method of claim 2, wherein said forming a dummy gate comprises forming a first layer and forming a second layer above the first layer, and wherein the removing comprises removing the second layer prior to forming the at least one inner spacer and removing the first layer subsequent to forming the at least one inner spacer.

4. The method of claim 1, wherein said forming stair-shaped, raised source and drain regions further comprises growing semiconductor material over the substrate and within the at least one undercut in a single epitaxial growth step.

5. The method of claim 1, further comprising:
   forming recesses in the substrate to fabricate a source stressor that is within the substrate and is below the raised source region and a drain stressor that is within the substrate and is below the raised drain region, wherein the source stressor and the drain stressor provide a respective stress to a channel between the source region and the drain region to enhance the conductivity of the channel.

6. The method of claim 5, wherein said forming stair-shaped, raised source and drain regions further comprises growing semiconductor material over the substrate, within the at least one undercut and within the recesses in a single epitaxial growth step.

7. The method of claim 5, wherein the forming stair-shaped, raised source and drain regions further comprises doping the stair-shaped, raised source and drain regions such that the source and drain stressors remain un-doped.

8. The method of claim 1, wherein the forming the stair-shaped, raised source and drain regions comprise forming an extension on at least one of the raised source or drain regions and wherein the extension laterally abuts a gate dielectric of the replacement gate.

* * * * *